(12) United States Patent  
Yin (10) Patent No.: US 9,817,041 B2  
(45) Date of Patent: Nov. 14, 2017

(54) MM-WAVE FREQUENCY PEAK DETECTOR (71) Applicant: Yi Yin, Munich (DE)

(72) Inventor: Yi Yin, Munich (DE)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/027,272

(22) PCT Filed: Oct. 18, 2013

(86) PCT No.: PCT/IB2013/059449  
§ 371 (c)(1),  
(2) Date: Apr. 5, 2016

(87) PCT Pub. No.: WO2015/056055  
PCT Pub. Date: Apr. 23, 2015

(65) Prior Publication Data  
US 2016/0238637 A1 Aug. 18, 2016

(51) Int. Cl.  
*G01R 19/04* (2006.01)  
*G01R 21/01* (2006.01)

(52) U.S. Cl.  
CPC .............. *G01R 19/04* (2013.01); *G01R 21/01* (2013.01)

(58) Field of Classification Search  
CPC ...... G01R 19/04; G01R 19/30; G01R 19/165; G01R 19/10; G01R 19/2506; G01R 19/0092; G01R 21/01; G01R 17/02; G01R 11/60; G01R 11/64; G01R 11/56; G01R 21/1338; G01R 1/203; G01R 31/2642; H05K 5/1532

USPC ........ 324/103 P, 103 R, 117 R, 76.11–76.13, 324/76.41; 327/50, 52, 58, 65, 96, 62, 327/72, 77

See application file for complete search history.

(56) References Cited

U.S. PATENT DOCUMENTS

| 4,603,299 A * | 7/1986 | Monett ................. G01R 19/04 327/58 |
| 6,084,472 A | 7/2000 | Gilbert |
| 6,664,824 B2 | 12/2003 | Laws |

(Continued)

OTHER PUBLICATIONS

International Search Report for application PCT/IB2013/05449 (dated Jul. 15, 2014).

(Continued)

*Primary Examiner* — Thang Le  
(74) *Attorney, Agent, or Firm* — Charlene R. Jacobsen (57) ABSTRACT

A peak detector circuit comprises a first output coupled to ground by a first load and to emitter terminals of first and second switching devices. A second output is coupled to ground by a second load and to emitter terminals of third and fourth switching devices. A third output is coupled to a supply voltage node by a third load and to collector terminals of the first and second switching devices. A fourth output is coupled to the supply voltage node by a fourth load and to collector terminals of the third and fourth switching devices. The first, second, third, and fourth switching devices have control terminals which are biased with a common bias voltage. The first, second, third and fourth load are selected so that $R1=R2=\alpha f*R3=\alpha f*R4$, with R1, R2, R3, R4 being a resistance of the first, second, third and fourth loads, respectively, and $\alpha f$ a common-base current gain of the switching devices.

18 Claims, 6 Drawing Sheets

(56) References Cited

U.S. PATENT DOCUMENTS

| | | | |
|---|---|---|---|
| 6,741,105 B2* | 5/2004 | Yasukouchi | H03K 5/2418 327/66 |
| 6,762,627 B1 | 7/2004 | Gater | |
| 7,355,456 B2 | 4/2008 | Kurtzman et al. | |
| 7,525,347 B1* | 4/2009 | Luo | H03K 5/1532 327/58 |
| 8,841,968 B2* | 9/2014 | Hadji-Abdolhamid | H03F 3/19 330/252 |
| 2003/0025566 A1 | 2/2003 | Rogers | |
| 2004/0212401 A1 | 10/2004 | Chien | |
| 2004/0229582 A1 | 11/2004 | Miyasita et al. | |
| 2005/0197076 A1 | 9/2005 | Saito et al. | |
| 2005/0285634 A1* | 12/2005 | Doyle | G01R 19/04 327/72 |
| 2007/0030034 A1 | 2/2007 | Kurtzman et al. | |
| 2010/0073033 A1 | 3/2010 | Lim | |
| 2012/0014423 A1* | 1/2012 | Mirzaei | H03G 3/3042 375/224 |
| 2012/0314816 A1 | 12/2012 | Hsieh | |
| 2013/0090075 A1 | 4/2013 | Mirzaei et al. | |

OTHER PUBLICATIONS

Meyer, Robert G.; "Low-Power Monolithic RF Peak Detector Analysis"; IEEE Journal Solid-State Circuits, vol. 30, Issue 1; pp. 65-67 (Jan. 1995).

Presi, Cologero D. et al; "Fast Peak Detector with Improved Accuracy and Linearity for High-Frequency Waveform Processing"; IEEE International Symposium on Circuits and Systems; pp. 3884-3887 (2007).

Carey, Eoin et al; "High Frequency Devices In: Millimeter-Wave Integrated circuits"; Springer, US; pp. 33-72 (Dec. 5, 2005).

Graf, Rudolf F.; "NMOS In: Modern Dictionary of Electronics"; Elsevier Science; p. 504 (Aug. 11, 1999).

* cited by examiner

MM-WAVE FREQUENCY PEAK DETECTOR

FIELD OF THE INVENTION

This invention relates to a peak detector circuit and to a peak detector device comprising such a detector circuit. It also relates to a transmitter, a receiver or a transceiver device, in which the proposed peak detector is used for the power detection of the transferred signal in high frequency transmitter, receiver or transceiver.

BACKGROUND OF THE INVENTION

In US2013/009075 a peak detector (PD) is described comprising a pair NMOS as full differential inputs, a pair of PMOS as the other full differential inputs, a pair NMOS as reference path, and a pair of PMOS as reference path. A linearity compensation uses additional complementary devices such as the PMOS and NMOS pairs. This results in the PD having greater sensitivity, greater dynamic range. However, such a compensation can not be used in mmw-circuits due to speed limitation of the PMOS pairs used.

SUMMARY OF THE INVENTION

The present invention provides a peak detector circuit, a peak detector device, a transmitter device, a receiver device and/or a transceiver device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

Figure 1:
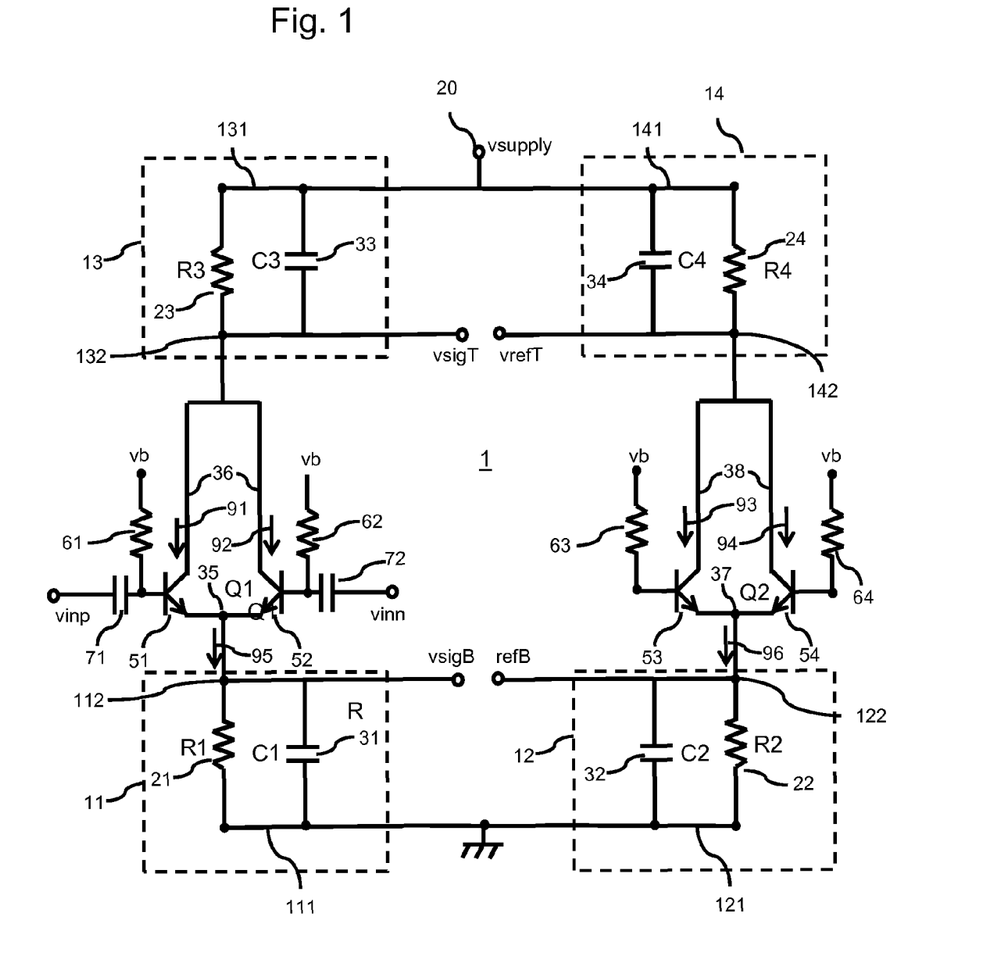
FIG. 1 schematically shows an example of an embodiment of a peak detector circuit.

FIG. 1 shows an example of an embodiment of a peak detector circuit 1. The peak detector circuit 1 also comprises a first switching device pair 51, 52, a second switching device pair 53, 54 and four loads 11, 12, 13, 14. In the embodiment of FIG. 1 the switching devices 51, 52, 53, 54 are bipolar transistors of the npn type. Other III-VI silicon transistors like MOS field or gallium arsenide (GaAs) are possible. The two transistors 51, 52 act as a two side non-linear rectifying element on a full-differential signal voltage vin.

The detector circuit 1 further comprises a first load 11 having a first 111 and a second terminal 112 with the first terminal 111 connected to ground, and a second load 12 having a first 121 and a second terminal 122 with the first terminal 121 connected to ground. Furthermore a third load 13 is arranged having a first 131 and a second terminal 132, with the first terminal 131 connected to a supply voltage node 20. A fourth load 14 is arranged having a first 141 and a second terminal 142 with the terminal 141 connected to the supply voltage node 20.

A first output vsigB is coupled to the second terminal 112 of the first load 11 and coupled to both the emitter terminals of the first and second switching device 51, 52 which have a common emitter point 35. A second output vrefB is coupled to the second terminal 122 of the second load 12 and coupled to both emitter terminals of the third and fourth switching device 53, 54.

A third output vsigT is coupled to the second terminal 132 of the third load 13 and coupled to both collector terminals 36 of the first and second switching device 51, 52.

Finally a fourth output vrefT is coupled to the second terminal 142 of the fourth load 14, and coupled to both collector terminals 38 of the third and fourth switching device 53, 54.

In this embodiment, the control terminal of the transistor 51 (e.g. the base terminals in case of an npn transistor) receives a voltage vino via a AC coupled capacitor 71 and the control terminal of the transistor 52 receives a voltage vinn via a AC coupled capacitor 72, where vino and vinn have opposing signs. The differential input signal is coupled to a terminal 35 (e.g emitter of an npn transistor) and a terminal 36 (e.g. collector of an npn transistor), with the load 11 to ground and load 13 to supply, respectively. The two transistors 53, 54 and its loads 12, 14 act as a DC compensation element, which have the same configuration as the two transistors 51, 52 and its loads 11 and 13. Since the switching devices 51, 52, 53, 54 have associated control terminals, which receive a common bias voltage vb via the resistors 61, 62, 63, 64, the DC values at bottom side outputs vsigB and refB are the same, whereas at top side outputs vsigT and vrefT are the same.

In the peak detector circuit 1 of FIG. 1 two output voltages can be defined; a voltage output at the top, i.e. voutT, and a voltage output at the bottom of the circuit, i.e. voutB, where voutT=vsigT−vrefT and voutB=vsigB−vrefB. The two transistors 53, 54 are arranged to set up a biasing DC voltage so that voutB and voutT are zero when an AC input signal is zero. The two transistors 53, 54 are also referred to as reference pair Q2, while the transistors 51, 52 are referred to as the input pair Q1.

In the embodiment of FIG. 1, each of the loads 11, 12, 13, 14 comprises a resistor 21, 22, 23, 24 respectively, and a capacitor 31, 32, 33, 34 arranged in parallel with one of the resistors. The capacitors 31, 33 are used here to bypass the AC signal and its harmonics to ground, therefore only DC voltage appears at the outputs vsigT and vsigB. The capacitors 32, 34 are normally not necessary due to vrefT and vrefB are DC bias voltages, but it is better to have them to have balanced loading to overcome the unwanted noise signal, which is coupled from the system.

In FIG. 1, the arrows 91, 92 indicate the collector currents of the Q1 transistors 51, 52 respectively. The collector current 91 of transistor 51 comprises a DC component $I_{C1p}$ and an AC component $i_{c1p}$, so the total current is equal to $I_{C1p}+i_{c1p}$. Similarly, the collector current 92 of transistor 52 is equal to $I_{C1n}+i_{c1n}$. The arrow 95 indicates the common emitter current of the transistors 51, 52. The arrows 93, 94 indicate the collector currents of the transistors 53, 54 of the reference pair Q2, being referred to as $I_{C2p}+i_{c2p}$ and $I_{C2n}+i_{c2n}$ The arrow 96 indicates the common emitter current of the transistors 53, 54.

For a bipolar transistor the collector and emitter currents in active mode are well modeled by an approximation to the Ebers-Moll model:

$$i_c+I_C=\alpha_f(i_e+I_E)=i_0 e^{(vbe+VBE)/VT} \qquad (1)$$

where $i_b$, $i_e$ and $v_{be}$ indicate the collector current, the emitter current and the base emitter voltage for small signal, respectively, and $I_C$, $I_E$ and $V_{BE}$ indicate the DC collector current, the emitter current and the base emitter voltage, respectively, and of is the common-base current gain.

Since the input pair Q1 and the reference pair Q2 are biased with same DC value vb, the DC collector currents are the same, i.e. $I_{C1p}=I_{C1n}=I_{C2p}=I_{C2n}=I_C$, and the emitter current are the same, i.e. $I_{E1}=I_{E2}=I_E$.

The DC values are generated not only at the signal path (i.e. pair Q1) at the detector output vsigB of the bottom side; vsigT of the top side, but also the reference path (i.e. pair Q2) at the detector output vrefB of the bottom site; vrefT of the top site. This is true at the emitter side, and also the collector side. Therefore the DC offsets of the signal path are compensated with the reference path, so that the outputs VoutB and VoutT are equal to zero when the AC signal is zero. This means that the detector circuit is immune to PVT variations.

Below it is assumed that the input signals are sinusoidal differential signals, and that they can be written as: vinp=A*sin ωt and vinn=−A*sin ωt, with A the signal amplitude, and ω the signal frequency. The small signal emitter current $i_e$ can be calculated using:

$$i_e = (i_{e1p} + i_{e1n}) \approx \frac{I_0}{\alpha_f}\left(1 + \frac{\left(\frac{v_{inp}}{V_T}\right)^2}{2!} + \frac{\left(\frac{v_{inp}}{V_T}\right)^4}{4!} + ...\right) + \frac{I_0}{\alpha_f}\left(1 + \frac{\left(\frac{v_{inn}}{V_T}\right)^2}{2!} + \frac{\left(\frac{v_{inn}}{V_T}\right)^4}{4!} + ...\right) \qquad (2)$$

where $V_T$ is the threshold voltage of the transistors 51,52. Since the terms of high power of (Vin/VT) are shorted to ground due to the capacitance loading therefore the differential output voltage VoutB can be calculated using:

$$V_{outB}=(i_{e1p}+i_{e1n})*R_1 \sim A^2 \qquad (3)$$

And the differential output voltage VoutT can be calculated using:

$$V_{outT}=(i_{c1p}+i_{c1n})*R_3 \sim A^2 \qquad (4)$$

This means that the sensitivity of the detector circuit is proportional to the square of the amplitude A of the signal.

When the values of the resistors 21, 22, 23, 24 are set so that R1=R2=αf*R3=αf*R4, the total detector output can be written as follows:

$$V\_detector=VoutB-VoutT=(vsigB-vrefB)-(vsigT-vrefT) \qquad (5)$$

Since vsigB and VsigT have revised signal sign. That is when vsigB goes high, the vsigT goes low. Both are differential signals but they have different DC biasing vrefB and vrefT and thus:

$$V\_detector=i_e*R1+i_c*R3=(i_c/\alpha f)*\alpha f*R3^* + i_c*R3=2*i_c*R3 \sim 2*A^2 \qquad (6)$$

So by suitably selecting the load resistance values, the dynamic range of the detector output is extended 2 times as compared to the state of the art detectors.

Figure 2:
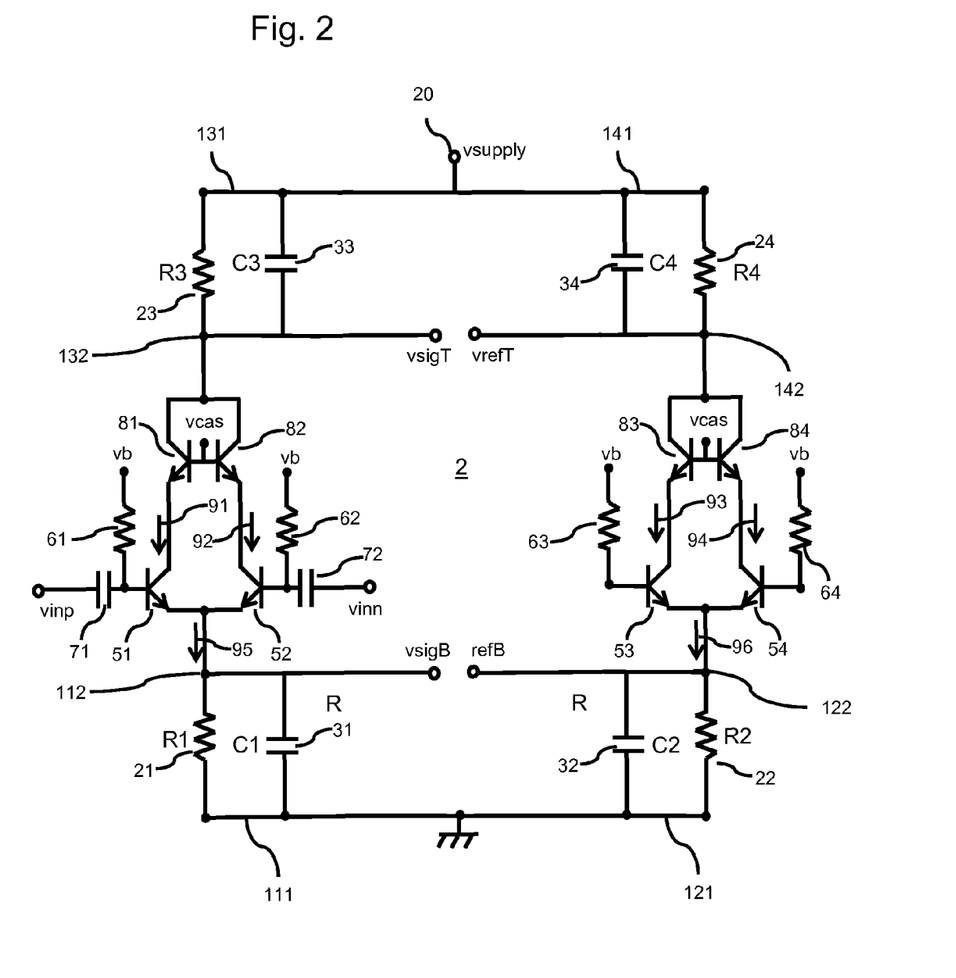
FIG. 2 shows an example of a further embodiment of a peak detector circuit.

FIG. 2 shows an example of a further embodiment. The detector circuit 2 comprises all the components of the embodiment of FIG. 1 and in addition two pairs of cascade transistors 81, 82 and 83, 84. The first pair of cascade transistors 81, 82 is arranged between the output vsigT and the. collector of the first and second switching device 51, 52. The first pair of cascaded transistors 81, 82 is arranged to bias the first and second switching device 51, 52. The second pair of cascade transistors 83, 84 is arranged between the reference output vrefT and the collector of the third and fourth switching device 53, 54. The second pair of cascaded transistors is arranged to bias the third and fourth switching device. In a further embodiment only one of the two cascade pairs is present.

By adding one or two cascaded transistor pairs an improved biasing for the Q1 and Q2 pairs is possible.

Figure 3:
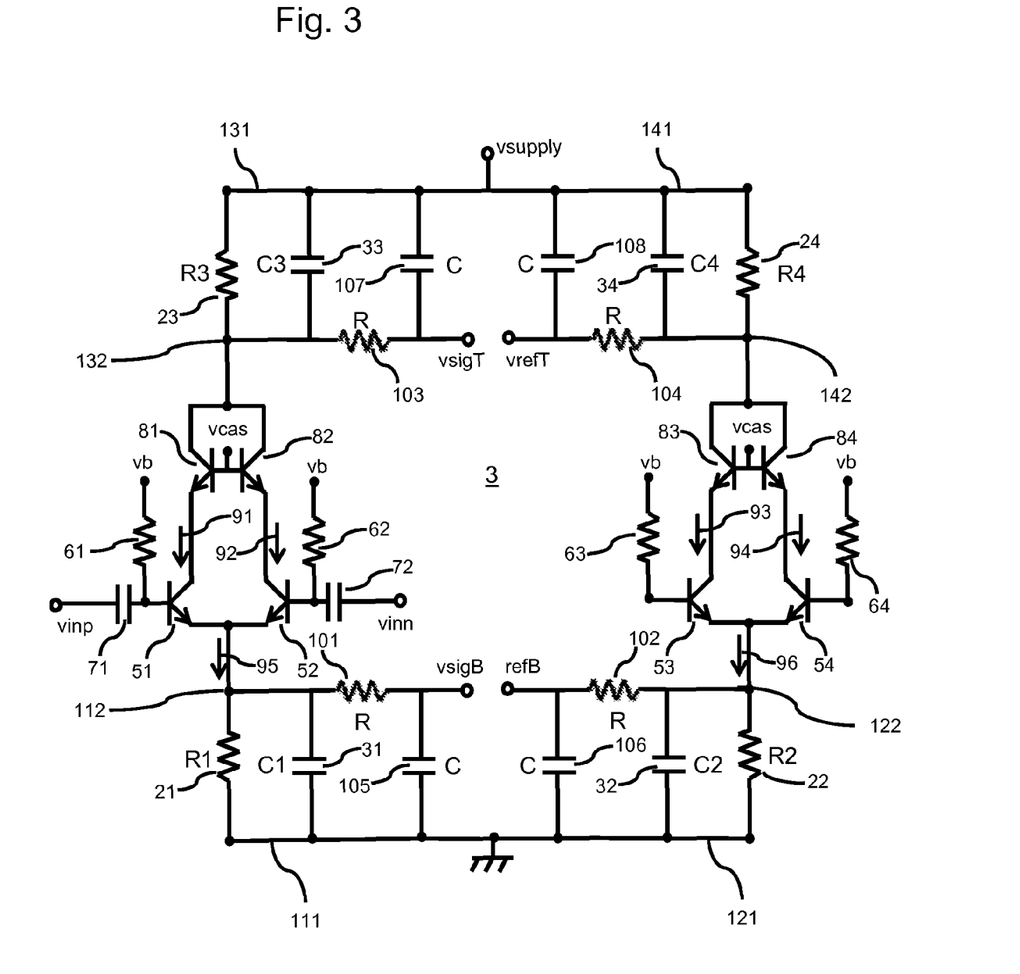
FIG. 3 shows a further embodiment of the detector circuit.

FIG. 3 shows a further embodiment of the detector circuit. In FIG. 3 a detector circuit 3 comprises all the components of the circuit of FIG. 2 but also at each output terminal vsigB, vrefB, vsigT, vrefT an additional low pass filter. In the embodiment of FIG. 3, the low pass filters comprise a resistor and a capacitor, see resistors 101, 102, 103, 104, and capacitors 105, 106, 107, 108. Other low pass configurations are conceivable. The low pass filters suppress the AC signal and its harmonics to ground, therefore only DC voltage appears at the detector output, which is proportional to $A^2$.

As mentioned above, the first, second, third, and fourth switching devices may comprise hetero-junction bipolar transistors. Alternatively the switching devices may comprise NMOS transistors. Both npn and NMOS transistors are very suitable for mmWave applications due to high-speed characterization. The other high speed device like III-IV silicon devices as gallium arsenide (GaAs), etc. can also be used.

Figure 4:
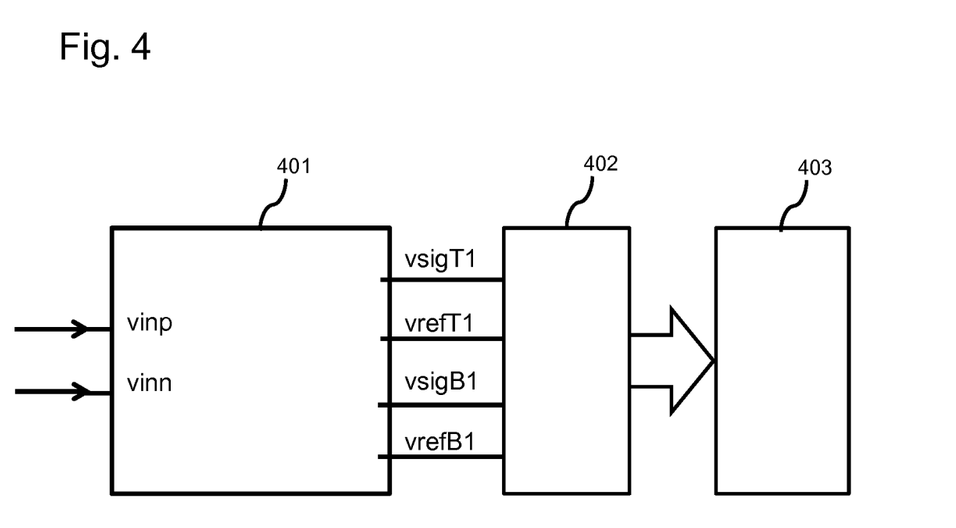
FIG. 4 shows an embodiment of a peak detector device.

FIG. 4 shows an embodiment of a peak detector device 4. The peak detector device 4 comprises a peak detector circuit 401 which may be one of the circuits described with reference to FIG. 1-3. The peak detector device 4 may also comprise a serial peripheral interface bus (SPI) or a parallel bus 402 arranged to sequentially with SPI, or simultaneously with the parallel bus, measure voltages vsigT1, vrefT1, vsigB1, vrefB1 of the first, second, third and fourth output of the circuit 401. Furthermore a signal processing block 403 is comprised which is arranged to receive the measured voltages and calculate the detector voltage Vdetector using the formula (5) mentioned above. The signal processing block 403 may comprise operational amplifiers (processing in analog domain) or it may comprise an ADC and a DSP (digital signal processor).

Figure 5:
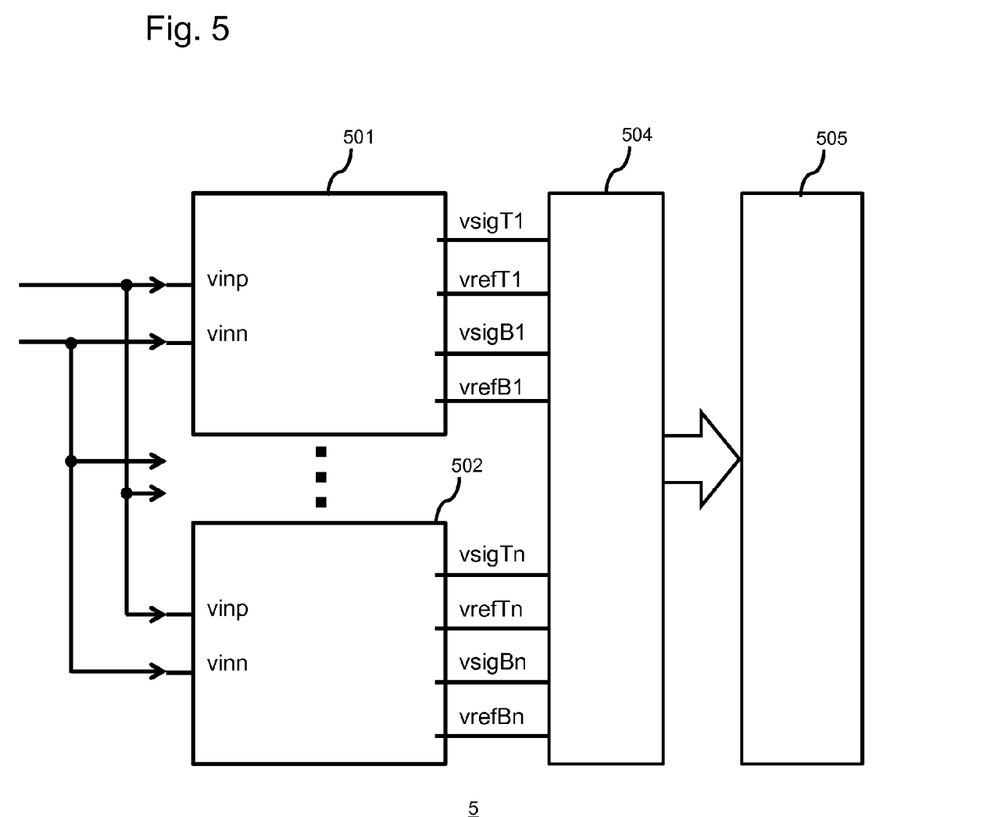
FIG. 5 shows a further embodiment, in which a peak detector device comprises a plurality of peak detector circuits.

FIG. 5 shows a further embodiment, in which a peak detector device 5 comprises a plurality of peak detector circuits 501,502. Also a serial peripheral interface bus or a parallel bus 504 is present which is arranged to sequentially or simultaneously measure for each of the peak detector circuits, 501,502, voltages of the first, second, third and fourth output. A signal processor 505 is arranged to receive the measured voltages and calculate an average sensor voltage Vdetector_av with:

$$V\text{detector\_av} = (v\text{sig}B1 - v\text{ref}B1 + v\text{ref}T1 - v\text{sig}T1 + \ldots + v\text{sig}Bn - v\text{ref}Bn + v\text{ref}Tn - v\text{sig}Tn)/N$$

where vsigBn is the first output of a n-th circuit, vrefBn is the second output of a n-th circuit, vrefTn is the third output of a n-th circuit, vsigTn is the fourth output of a n-th circuit, with n=1, . . . , N, with N being an integer value larger than 1.

Figure 6:
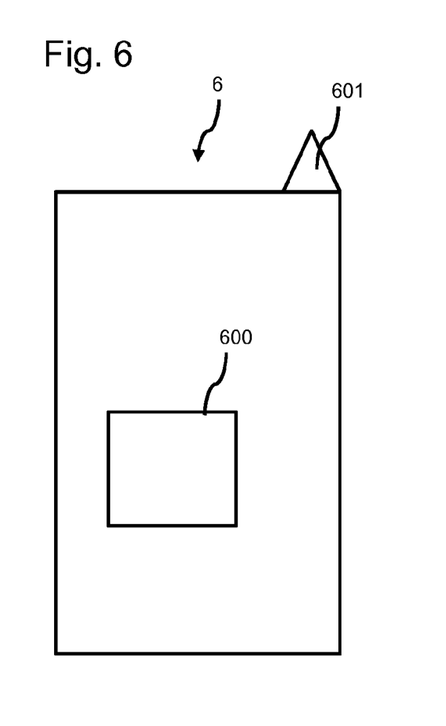
FIG. 6 schematically shows a transmitter device according to an embodiment.

FIG. 6 schematically shows a transmitter device according to an embodiment of a further aspect of the invention. The transmitter device 6 comprises at least one peak detector device 600 which may be one of the peak detector devices described above, to detect the signal power levels in the transmitter chain. The transmitter device 6 comprises an antenna 601 and may be a mobile phone or any other high frequency transmitter like Radio frequency (RF), or millimeter wave frequency (mmw) transmitter, etc.

Figure 7:
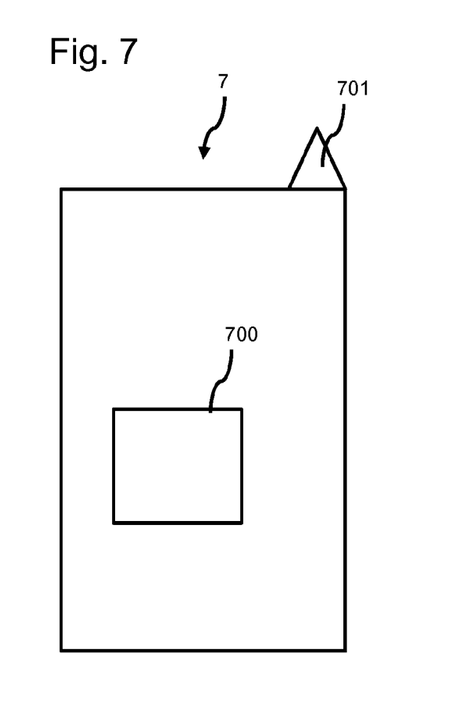
FIG. 7 schematically shows a receiver device according to an embodiment.

FIG. 7 schematically shows a receiver device according to an embodiment of a further aspect of the invention. The receiver device 7 comprises at least one peak detector device 700 which may be one of the peak detector devices described above, to detect the signal power levels in the received signal chain from the antenna to IF outputs. The receiver device 7 comprises an antenna 701. The receiver device 7 may be a mobile phone or any other high frequency receiver like Radio frequency (RF), or millimeter wave frequency (mmw) transmitter, etc.

According to yet a further aspect of the invention, there is provided a transceiver (transmitter and receiver) which may comprise one or several peak detector devices which may be one of the peak detector devices described above, to detect the signal power levels in the transmitter and received signal chain. The transceiver may have the functionalities of both the receiver and transmitter shown in FIGS. 6 and 7. The transceiver may be a RF or a mmWave transceiver.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Because the devices implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A peak detector circuit comprising:
   a first switching device having a collector terminal, an emitter terminal, and a control terminal;
   a second switching device having a collector terminal, an emitter terminal, and a control terminal;
   a third switching device having a collector terminal, an emitter terminal, and a control terminal;
   a fourth switching device having a collector terminal, an emitter terminal, and a control terminal;
   a first load having a first terminal and a second terminal, said first terminal of said first load being connected to a ground;
   a second load having a first terminal and a second terminal, said first terminal of said second load being connected to a ground;
   a third load having a first terminal and a second terminal, said first terminal of said third load being connected to a supply voltage node;
   a fourth load having a first terminal and a second terminal, said first terminal of said fourth load being connected to said supply voltage node;
   a first output coupled to said second terminal of said first load and coupled to both of said emitter terminals of said first and second switching devices;
   a second output coupled to said second terminal of said second load and coupled to both of said emitter terminals of said third and fourth switching devices;
   a third output coupled to said second terminal of said third load and coupled to both of said collector terminals of said first and second switching devices; and
   a fourth output coupled to said second terminal of said fourth load, and coupled to both of said collector terminals of said third and fourth switching devices, where said control terminals of said first and second switching devices are arranged to receive a differential input voltage, whereby said control terminals of said first, second, third, and fourth switching devices are arranged to be biased with a common DC bias voltage, and whereby said first, second, third and fourth load are selected so that:

$$R1=R2=\alpha f*R3=\alpha f*R4, \text{ with}$$

R1, R2, R3, R4 a resistance of said first, second, third and fourth load, respectively, and of a common-base current gain of said switching devices.

2. The peak detector circuit according to claim 1, wherein a first pair of cascade transistors is arranged between said second terminal of said third load and said collector terminals of said first and second switching devices.

3. The peak detector circuit according to claim 1, wherein a second pair of cascade transistors is arranged between said second terminal of said fourth load and said collectors terminals of said third and fourth switching devices.

4. The peak detector circuit according to claim 1, wherein each of said firth, second, third, and fourth loads comprises a resistor and a capacitor, wherein said capacitor is arranged to bypass an AC signal and its harmonics to ground.

5. The peak detector circuit according to claim 1, wherein each of said first, second, third and fourth output is coupled to said second terminal of each of said first, second, third and fourth load via a low pass filter.

6. The peak detector circuit according to claim 5, wherein said low pass filter comprises a capacitor and a resistor.

7. The peak detector circuit according to claim 1, wherein said first, second, third, and fourth switching devices comprise npn bipolar transistors.

8. The peak detector circuit according to claim 1, wherein said first, second, third, and fourth switching devices comprise hetero-junction bipolar transistors.

9. The peak detector circuit according to claim 1, wherein said first, second, third, and fourth switching devices comprise NMOS transistors.

10. The peak detector circuit according to claim 1, wherein said first, second, third, and fourth switching devices comprise III-IV silicon devices, such as gallium arsenide (GaAs) devices.

11. The peak detector device comprising at least one peak detector circuit according to claim 1, wherein said peak detector device comprises an interface bus, such as a serial peripheral bus or a parallel interface bus, arranged to measure voltages of said first, second, third and fourth outputs, and a signal processing block arranged to handle said measured voltages and calculate a sensor voltage Vsensor where:

$$V\text{sensor}=(v\text{sig}B-v\text{ref}B)-(v\text{sig}T-v\text{ref}T),$$

where vsigB is a voltage of said first output, vrefB is a voltage of said second output, vrefT is a voltage of said third output, vsigT is a voltage of said fourth output.

12. The peak detector device according to claim 11, wherein said peak detector device comprises a plurality of peak detector circuits, wherein said interface bus is arranged to sequentially or simultaneously measure voltages of said outputs of said plurality of peak detector circuits and wherein said signal processing block is arranged to process said measured voltages and calculate an average detector voltage Vdetector_av where:

$$V\text{detector\_av}=((v\text{sig}B1-v\text{ref}B1)-(v\text{sig}T1-v\text{ref}T1)+\ldots\\ .+(v\text{sig}Bn-v\text{ref}Bn)-(v\text{sig}Tn-v\text{ref}Tn))/N$$

where vsigBn is a voltage of said first output of a n-th circuit, vrefBn is a voltage of said second output of a n-th circuit, vrefTn is a voltage of said third output of a n-th circuit, vsigTn is a voltage of said fourth output of a n-th circuit, with n=1, . . . , N, with N being an integer value larger than 1.

13. A transmitter device comprising the peak detector circuit according to claim 1.

14. The transmitter device according to claim 13, wherein the transmitter device is a millimeter wave (mm Wave) transmitter.

15. A receiver device comprising the peak detector circuit according to claim 1.

16. The receiver device according to claim 15, wherein the receiver device is a millimeter wave (mm Wave) receiver.

17. A transceiver device comprising the peak detector circuit according to claim 1.

18. The transceiver device according to claim 17, wherein the transceiver device is a millimeter wave (mm Wave) transceiver.

* * * * *